United States Patent
Wong

(10) Patent No.: US 6,954,115 B2
(45) Date of Patent: Oct. 11, 2005

(54) METHODS AND APPARATUS FOR TUNING SUCCESSIVE APPROXIMATION

(75) Inventor: Lance M. Wong, San Francisco, CA (US)

(73) Assignee: RF Stream Corporation, Osaka (JP)

( * ) Notice: Subject to any disclaimer, the term of this patent is extended or adjusted under 35 U.S.C. 154(b) by 114 days.

(21) Appl. No.: 10/448,605

(22) Filed: May 29, 2003

(65) Prior Publication Data

US 2003/0222729 A1 Dec. 4, 2003

Related U.S. Application Data

(60) Provisional application No. 60/384,290, filed on May 29, 2002.

(51) Int. Cl.[7] ................................................. H03H 7/01
(52) U.S. Cl. ...................... 333/17.1; 333/174; 333/185
(58) Field of Search ............................... 333/17.1, 174, 333/185, 175; 348/731; 455/188.2, 192

(56) References Cited

U.S. PATENT DOCUMENTS

| | | | |
|---|---|---|---|
| 1,735,742 A | 11/1929 | Fetter | |
| 2,140,770 A | 1/1938 | Schofield | |
| 2,325,174 A | 7/1943 | Cooper | |
| 2,464,557 A | 3/1949 | Crockett | |
| 2,496,177 A | 1/1950 | Richards et al. | |
| 2,531,312 A | 1/1950 | Loon | |
| 2,549,789 A | 4/1951 | Ferrill | |
| 2,796,524 A | 6/1957 | Ferrill | |
| 2,801,341 A | 7/1957 | Jaffe | |
| 3,252,096 A | 5/1966 | Carlson | |
| 3,400,345 A | 9/1968 | Oloff | |
| 3,509,500 A | 4/1970 | McNair et al. | |
| 3,544,903 A | 12/1970 | Sakamoto | |
| 3,794,941 A | 2/1974 | Templin | |
| 3,931,578 A | 1/1976 | Gittinger | |
| 4,118,679 A | 10/1978 | Hiday et al. | |
| 4,138,654 A | 2/1979 | Luhowy | |
| 4,456,895 A | 6/1984 | Landt et al. | |
| 4,514,763 A | 4/1985 | Rindal | |
| 4,598,423 A | 7/1986 | Hettiger | |
| 4,785,253 A | 11/1988 | Hughes | |
| 4,789,897 A | 12/1988 | Kappeler et al. | |
| 4,812,851 A | 3/1989 | Giubardo | |
| 4,818,903 A | 4/1989 | Kawano | |
| 4,970,479 A | 11/1990 | Landt et al. | |
| 5,187,445 A | 2/1993 | Jackson | |
| 5,491,715 A | 2/1996 | Flaxl | |
| 5,519,265 A | 5/1996 | Latham, II | |

(Continued)

FOREIGN PATENT DOCUMENTS

| | | |
|---|---|---|
| EP | 0 392 449 A1 | 10/1990 |
| EP | 0 676 880 A2 | 10/1995 |
| EP | 0 707 379 A1 | 4/1996 |
| WO | WO 95 22839 A2 | 8/1995 |
| WO | WO 01/06637 A1 | 1/2001 |
| WO | WO 01 28310 A2 | 4/2001 |

*Primary Examiner*—Lam T. Mai
(74) *Attorney, Agent, or Firm*—Stattler Johansen & Adeli LLP

(57) ABSTRACT

A method for tuning a filter to a desired frequency using successive approximation. Elements of the filter are selected according to a control code used to vary the filter's oscillation frequency. The control code is set to the middle of the control code range and resulting oscillation frequency is compared to the desired frequency. If the control code needs to be increased, the control code is set to ¾ of the control code range. If the control code needs to be decreased, the control code is set to ¼ of the control code range. The method continues using successive approximation to determine the value of each bit of the control code. Thus, successive approximation is used to converge on the value of the control code that produces an oscillation frequency of the filter that is closest to the desired frequency (with a maximum error of 1 least significant bit).

21 Claims, 6 Drawing Sheets

U.S. PATENT DOCUMENTS

| | | | |
|---|---|---|---|
| 5,525,940 A * | 6/1996 | Heikkila et al. | 333/17.1 |
| 5,663,773 A | 9/1997 | Goeckler | |
| 5,737,035 A | 4/1998 | Rotzoll | |
| 6,226,509 B1 | 5/2001 | Mole et al. | |
| 6,256,495 B1 | 7/2001 | Francisco et al. | |
| 6,275,113 B1 | 8/2001 | Nakano et al. | |
| 6,307,442 B1 * | 10/2001 | Meyer et al. | 333/17.1 |
| 6,307,443 B1 | 10/2001 | Gabara et al. | |
| 6,324,233 B1 | 11/2001 | Sempel et al. | |
| 6,351,293 B1 | 2/2002 | Perlow | |
| 6,377,315 B1 | 4/2002 | Carr et al. | |
| 6,535,075 B2 * | 3/2003 | Frech et al. | 333/17.1 |
| 6,535,722 B1 | 3/2003 | Rosen et al. | |
| 6,538,521 B2 | 3/2003 | Kobayashi et al. | |
| 6,553,722 B1 * | 4/2003 | Porret et al. | 49/507 |
| 6,593,828 B1 | 7/2003 | Hefenstein et al. | |
| 6,750,734 B2 * | 6/2004 | Utsunomiya et al. | 333/17.1 |

\* cited by examiner

METHODS AND APPARATUS FOR TUNING SUCCESSIVE APPROXIMATION

CROSS-REFERENCES TO RELATED APPLICATIONS

This application claims the benefit of U.S. Provisional Patent Application No. 60/384,290, filed May 29, 2002, entitled "Fast Tuning Algorithm for TV Reception."

BACKGROUND OF THE INVENTION

1. Field of the Invention

The present invention is directed towards the field of tuning algorithms, and more particularly towards tuning algorithms using successive approximation.

2. Art Background

Typically, receivers employ filters to condition both input signals and internally generated reference signals. For example, bandpass, notch, and low pass are types of filters employed in receivers. The frequency response of a filter refers to the characteristics of the filter that condition the signal input to the filter. For example, a bandpass filter may attenuate an input signal across a pre-determined band of frequencies above and below a center frequency of the filter. Filters are designed to exhibit frequency responses based on one or more circuit parameters.

Some receivers are designed to process input signals with a range of input carrier frequencies (e.g., wide band receivers). For example, television receivers must be capable of processing input television signals with carrier frequencies ranging from 55 MHz to 880 MHz. One circuit parameter used to define the frequency response of a filter is the carrier frequency of an input signal. Thus, such wide band receivers require filters to generate multiple frequency responses to accommodate multiple input carrier frequencies. To accomplish this, some receivers employ tunable filters to process a wide band of input frequencies.

Tuning systems and algorithms are employed in the various types of tunable filters to tune the filter to a desired frequency, e.g., a channel frequency of a television channel. Tuning systems and algorithms are typically dependent on the type of filter to be tuned and thus are not easily made compatible with other types of filters. Also, conventional tuning systems and algorithms are hardware intensive. Therefore, there is a need for a tuning system and algorithm that is simple, accurate, and easily made compatible with various types of tunable filters.

SUMMARY OF THE INVENTION

Some embodiments provide a method for tuning a filter of a television tuner to a desired frequency using successive approximation. Elements (such as resistors or capacitors) of the filter are selected or deselected according to a control code which is used to vary the oscillation frequency of the filter. The method starts by setting the control code to a middle value of the control code range, i.e., by setting the most significant bit of the control code to 1 and all other bits in the control code to 0. The oscillation frequency of the filter resulting from the control code is then compared to the desired frequency to determine if the control code needs to be increased or decreased.

If the control code needs to be increased, the method successively approximates and sets the control code to ¾ of the value of the control code range, i.e., by also setting the next most significant bit of the control code to 1. If the control code needs to be decreased, the method successively approximates and sets the control code to ¼ of the value of the control code range, i.e., by setting the most significant bit of the control code to 0 and the next most significant bit to 1. The method continues using successive approximation to set the value of each next most significant bit of the control code until the value of the least significant bit of the control code is determined. Thus, the method uses successive approximation to converge on the value of the control code that produces an oscillation frequency in the filter that is closest to the desired frequency (with a maximum error of 1 least significant bit of the control code).

The methods of the present invention can be used with filters that increase in oscillation frequency as the value of the control code increases (e.g., RC filters) or with filters that decrease in oscillation frequency as the value of the control code increases (e.g., LC filters). The method of the present invention can be easily adapted from tuning one type of filter to the other type of filter by inverting the bits of the control code or by changing the basis of the comparison of the oscillation frequency of the filter and the desired frequency.

DETAILED DESCRIPTION

The disclosures of U.S. Provisional Patent Application No. 60/384,290, filed May 29, 2002, entitled "Fast Tuning Algorithm for TV Reception," and U.S. patent application Ser. No. 10/271,689, filed Oct. 15, 2002, entitled "Method and Apparatus for Tuning an LC Filter," are hereby expressly incorporated herein by reference.

Although the present invention is described below in terms of specific exemplary embodiments, one skilled in the art will realize that various modifications and alterations may be made to the below embodiments without departing from the spirit and scope of the invention. For example, methods of the present invention for tuning filters of a television tuner are described below. One skilled in the arts will realize, however, that the methods for tuning filters can also be applied to filters of other types of tuners. Also, some embodiments of the present invention relate to tuning RC type or LC type filters. It should be appreciated, however, that methods of the present invention may relate to any filter that exhibits monotonically increasing or monotonically decreasing oscillation frequencies as a control code (used to vary the frequency of the filter) increases in value.

Figure 1:
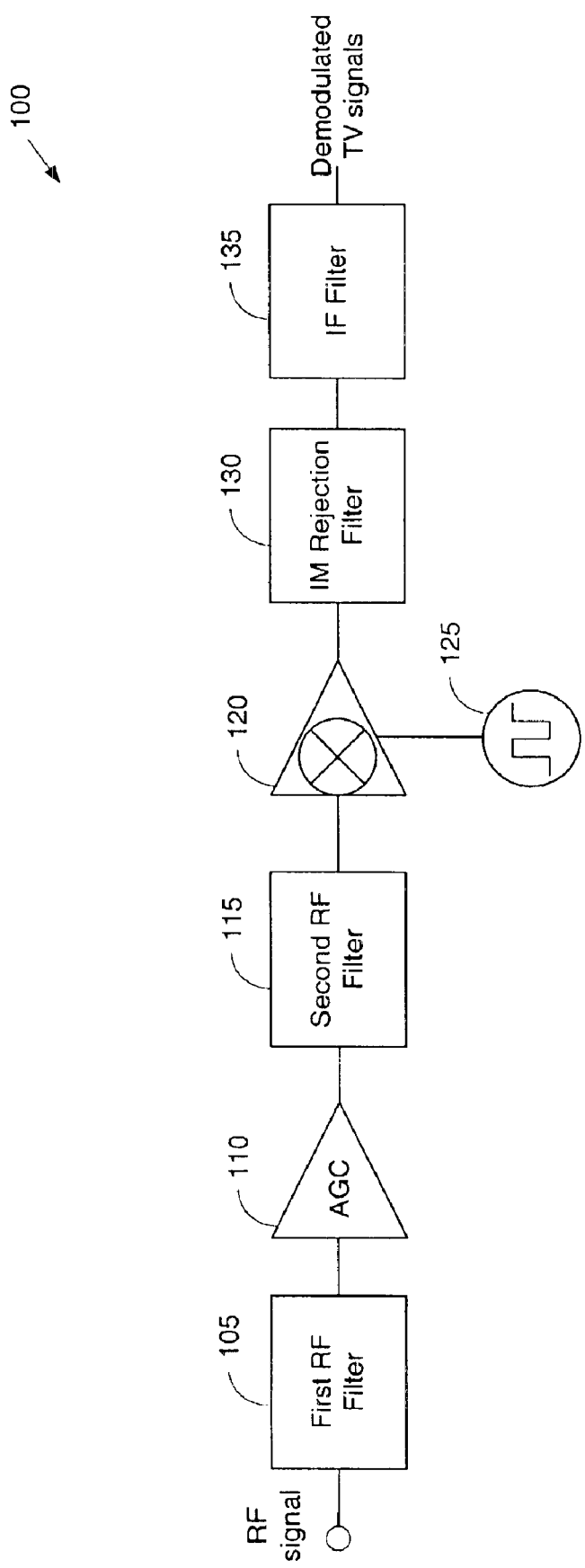
FIG. 1 is a block diagram illustrating a television tuner in which methods of the present invention may be implemented.

FIG. 1 is a block diagram illustrating a television tuner 100 in which methods of the present invention may be implemented. The television tuner 100 receives a radio frequency ("RF") television signal, and generates demodulated baseband television signals (i.e., picture and sound signals). For this embodiment, television tuner 100 includes a first RF filter 105, an automatic gain control circuit (AGC) 110, a second RF filter 110, a mixer (that includes an AGC) 120, a local oscillator 125, an image rejection filter 130, and an intermediate frequency (IF) filter 135.

In some embodiments, the first and second RF filters 105 and 115 are LC filters each comprised of inductive and capacitive banks (as described below in relation to FIG. 4). As described below, the first or second RF LC filters 105 and 115 are converted to an LC oscillator for tuning. After the RF LC filters 105 and 115 are tuned to a desired frequency, the filters are then used to provide a band pass filter function for the television receiver 100. The AGC 110 is coupled between the first and second RF filters and amplifies the signal, output from the first RF filter 105, for input to the second RF filter 115.

The television tuner 100 also contains a down conversion stage comprised of the mixer 120, the local oscillator 125, the image rejection filter 130, and the intermediate frequency (IF) filter 135. In some embodiments, the local oscillator 125 is an LC oscillator containing an LC filter comprised of inductive and capacitive banks. Also, in some embodiments, the image rejection filter 130 is notch RC filter comprised of capacitive and resistive banks (as described below in relation to FIG. 3) and the IF filter 135 is a band pass LC filter comprised of inductive and capacitive banks.

The down conversion stage converts the frequency of the filtered RF television signal to an immediate frequency (IF) that is determined by country standards. Generally, the down conversion stage mixes the input signal with a local oscillator signal to produce the IF signal. The image rejection notch filter 130 filters out the image and the IF band pass filter 135 attenuates signals at frequencies other than around the intermediate frequency (IF).

Each filter in the television tuner 100 may be converted to an oscillator and tuned to a desired frequency in accordance with methods of the present invention. In some embodiments, the second RF LC filter 115 is tuned first to determine inductance and capacitance values required to tune the filter to a desired frequency. The first RF LC filter 105 is then set to the inductance and capacitance values that were determined for the second RF LC filter 115. For the first and second RF LC filters, the desired frequency is the channel frequency of a selected television channel. The second RF LC filter 115 is tuned rather than the first RF LC filter 105 since the first RF LC filter 105 is next to an input pin where RF signals are received so that electromagnetic interference coupling may occur on the input pin. In other embodiments, both the first and second RF LC filters 105 and 115 are tuned individually.

After tuning and setting the first and second RF LC filters, the LC filter of the local oscillator 125 is tuned using methods of the present invention to determine inductance and capacitance values required to tune the filter to a desired frequency. The signal generated by the local oscillator 125 and the RF signal from the second RF filter 115 (the RF signal being filtered to the channel frequency) is received by the mixer 120. The mixer 120 mixes the received signals to produce a carrier signal at the intermediate frequency, the intermediate frequency being equal to the frequency of the local oscillator 125 minus the frequency of the signal from the RF signal (i.e., the channel frequency). Therefore, the frequency of the signal from the local oscillator 125 should be equal to the channel frequency plus the intermediate frequency. As such, the desired frequency to which the LC filter of the local oscillator 125 is to be tuned is equal to the channel frequency plus the intermediate frequency.

The RC image rejection filter 130 is then tuned using methods of the present invention to determine resistance and capacitance values required to tune the filter to a desired frequency. Since the image rejection filter 130 filters out the image coming out from the mixer, the desired frequency here is the intermediate frequency. The IF LC filter 135 is then tuned using methods of the present invention to determine inductance and capacitance values required to tune the filter to a desired frequency. Since the IF LC filter 135 attenuates signals at frequencies other than around the intermediate frequency (IF), the desired frequency here is also the intermediate frequency.

After each filter of the television tuner 100 is tuned to the desired frequency, each filter is then used to perform a particular filter function (e.g., RF band pass function, image rejection function, etc.). Note that although LC and RC filters are used in the television tuner 100, both types of filters may be tuned using methods of the present invention with minor modifications.

Figure 2:
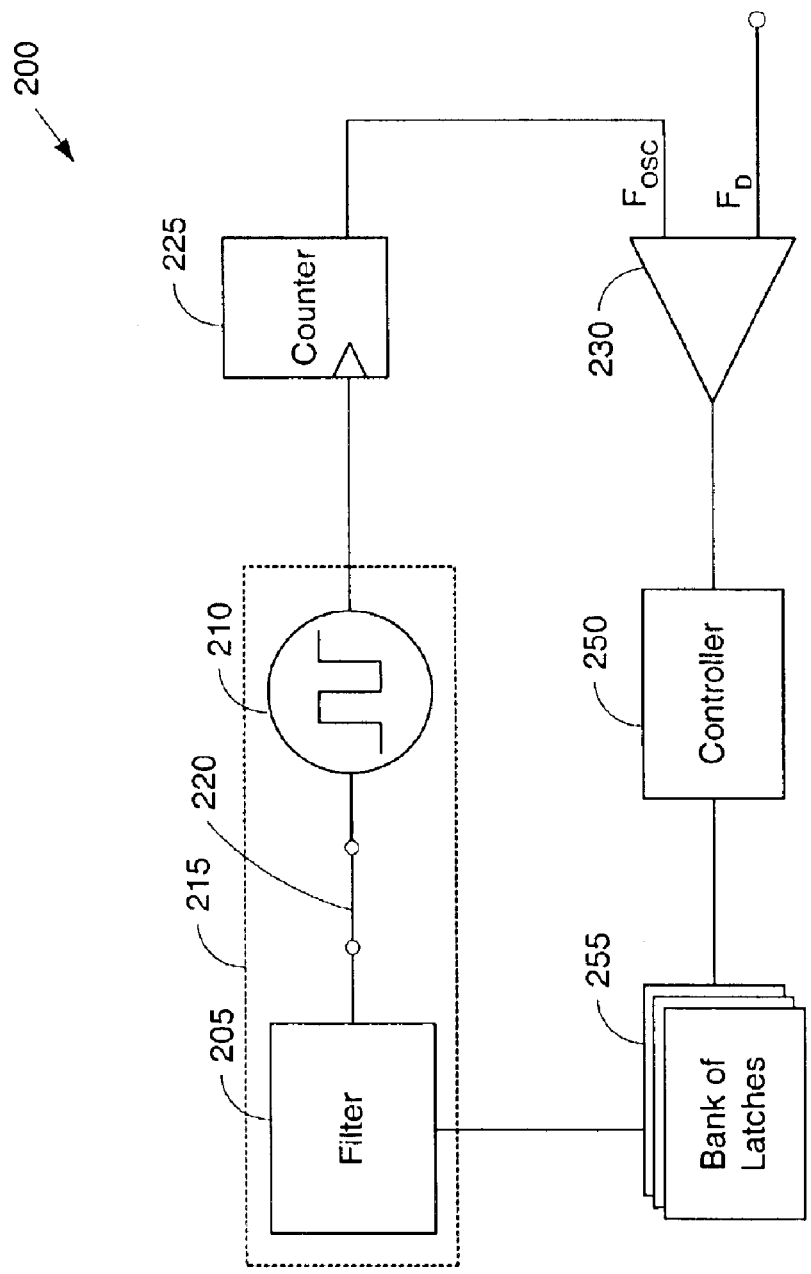
FIG. 2 is a block diagram illustrating a tuning system for tuning a filter to a desired frequency.

FIG. 2 is a block diagram illustrating a tuning system 200 for tuning a filter 205 to a desired frequency. The filter 205 may be, for example, an RF band pass filter, an image rejection notch filter, or an IF band pass filter used in a television tuner. The tuning system 200 includes an oscillator 210, a switch 220, a counter 225, a comparator 230, a controller 250, and a bank of latches 255 that are coupled together in a feedback loop.

In some embodiments, the filter 205 to be tuned is an RC filter where the RC filter integrates with the oscillator 210 to comprise an RC oscillator 215. In other embodiments, the filter 205 to be tuned is an LC filter where the LC filter integrates with the oscillator 210 to comprise an LC oscillator 215. The filter is the frequency-determining component of the oscillator. For the RC oscillator 215, the resistive and capacitive elements of the RC filter 205 determine its frequency. For the LC oscillator 215, the inductive and capacitive elements of the LC filter 205 determine its frequency.

In each iteration of the feedback loop, the controller 250 generates a control code using a successive approximation algorithm of the present invention. The control code is a digital code that is applied to switches contained in the filter 205 to select or deselect elements (such as resistors or capacitors) in the filter 205. A specific control code selects and deselects specific elements in the filter 205 so that the filter 205 produces a signal having a resonant frequency at a specific frequency. The control code produced by the controller 250 is sent to the bank of latches 255 where it is stored. As an option, the controller 250 may invert the bits of the control code before sending the control code to the bank of latches 255 in order to adapt the tuning system 200 to tune a different type of filter (as described below).

The control code is then sent from the bank of latches 255 to the RC or LC oscillator 215. For an RC oscillator 215, resistors in the RC filter of the RC oscillator are selected through switches according to the control code. For an LC oscillator 215, capacitors in the LC filter of the LC oscillator are selected through switches according to the control code. The oscillator 215 then produces a signal with an oscillation frequency that is determined by the combination of resistors or capacitors selected by the control code.

The signal produced by the RC or LC oscillator 215 is then sent to the counter 225 which measures the oscillation frequency ($F_{OSC}$) of the signal. The oscillation frequency ($F_{OSC}$) of the signal is sent to the comparator 230. The comparator 230 also receives the desired frequency ($F_D$) to which the filter 205 is to be tuned and compares the two received frequencies. If the filter 205 is an RC filter, the comparator 230 determines if the oscillation frequency ($F_{OSC}$) is greater than the desired frequency ($F_D$). If the filter 205 is an LC filter, the comparator 230 determines if the oscillation frequency ($F_{OSC}$) is less than the desired frequency ($F_D$). The comparator 230 sends an affirmative signal (e.g., a signal having a value of 1) or a negative signal (e.g., a signal having a value of 0) to the controller 250 depending on the results of the comparison.

The controller 250 receives the affirmative or negative signal from the comparator 230 and produces a modified control code using the affirmative or negative signal and the algorithm of the present invention. The algorithm of the present invention uses successive approximation to continually modify the control code until each bit of the control code has been determined. While the filter 205 is being tuned to the desired frequency, the switch 220 is closed to couple the filter 205 to the tuning system 200. After the filter 205 has been tuned to the desired frequency, the switch 220 is opened so the filter 205 may then be used for a filtering function, e.g., to filter RF signals.

Figure 3:
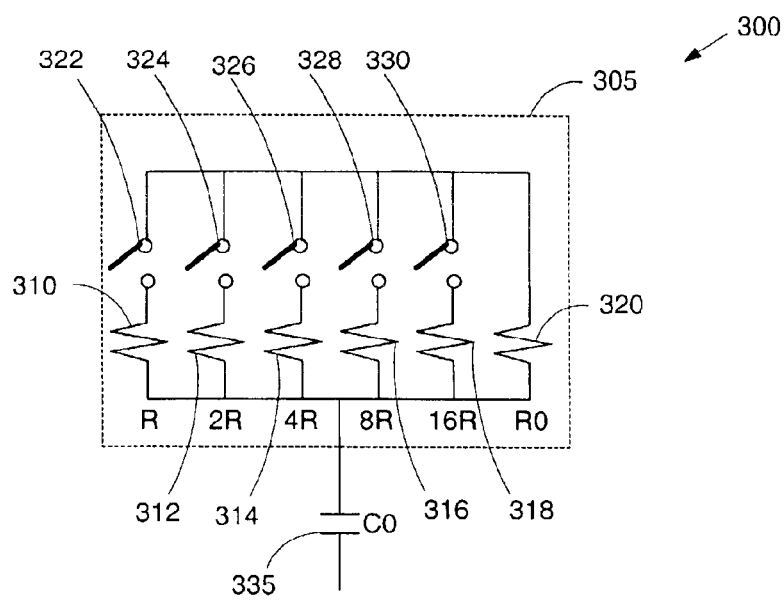
FIG. 3 illustrates one embodiment for an RC filter comprised of a resistive bank and a capacitor.

FIG. 3 illustrates one embodiment for an RC filter 300 comprised of a resistive bank 305 and a capacitor 335. For this embodiment, the resistive bank 305 includes six resistors (310, 312, 314, 316, 318, and 320). Although the RC filter 300 includes six resistors and one capacitor, any number of resistors or capacitors may be used without deviating from the spirit or scope of the invention. In one embodiment, the number and values for the resistors and capacitors is a function of the desired frequency response characteristics of the RC filter 300.

Each resistor is selected (i.e., added) or deselected (i.e., removed) from the resistive bank 305 through a corresponding switch (switches 322, 324, 326, 328, and 330). In one embodiment, the switches are implemented using metal oxide semiconductor ("MOS") transistors. Note that the sixth resistor 320 in the resistive bank 305 is always selected and has a predetermined resistance value of R0. The other five resistors (310, 312, 314, 316, and 318) are selected by the corresponding switches according to the control code produced by the controller 250.

In the example shown in FIG. 3, the control code would have 5 bits where each bit selects or deselects a resistor having a particular resistance value. For example, the least significant bit of the control code may be used to select or deselect a resistor having a resistance value of R and the most significant bit of the control code may be used to select or deselect a resistor having a resistance value of 16R. In some embodiments, a resistor is selected through its corresponding switch by a bit in the control code that is set to 1. Therefore, as more bits in the control code are set to 1 and the value of the control code increases, more resistors in the resistive bank 305 are selected. The control code produces a particular combination of selected and deselected resistors in the resistive bank 305 that causes the RC filter 300 to exhibit a particular oscillation frequency. Thus, the RC filter 300 can be tuned to different oscillation frequencies by varying the control code.

The resistors, which form resistive bank 305, are configured in parallel. Therefore, as the value of the control code increases and more resistors are selected, the effective resistance of the resistive bank 305 decreases. Since the oscillation frequency of an RC filter is equal to $1/[2*pi*R*C]$, the oscillation frequency of the RC filter increases as the control code increases.

Figure 5:
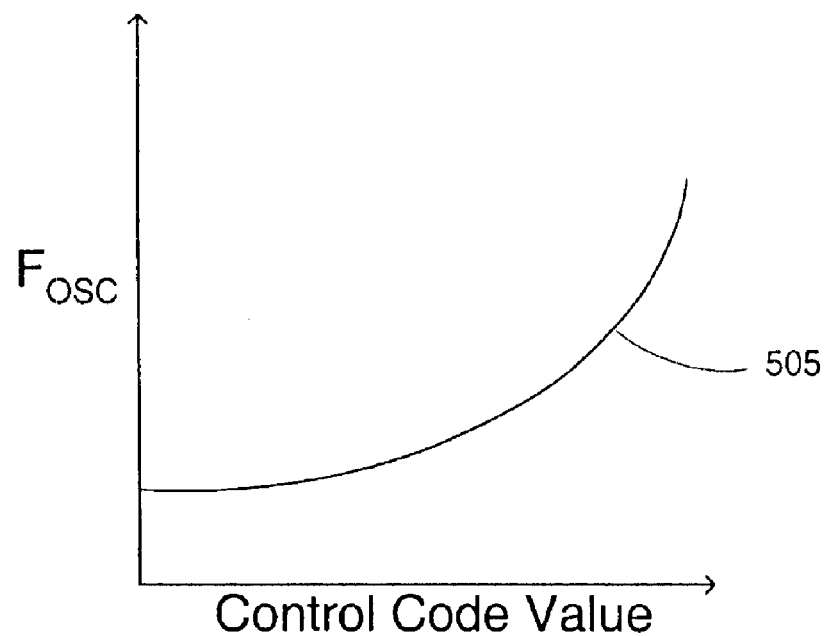
FIG. 5 is a graph that shows an example of the relationship between the oscillation frequency of an RC filter and the value of the control code.

FIG. 5 is a graph that shows an example of the relationship between the oscillation frequency of an RC filter and the value of the control code. As the values of the control code increases, the oscillation frequency of an RC filter increases along an oscillation curve 505. Note that as the control code increases, the oscillation frequency of an RC filter increases monotonically, i.e., the oscillation frequency follows an oscillation curve 505 that always has a positive slope. In accordance with the present invention, any type of filter having an oscillation frequency that is monotonically increasing as the value of the control code increases may be tuned in the same manner as an RC filter, as described below in relation to FIG. 7.

Figure 4:
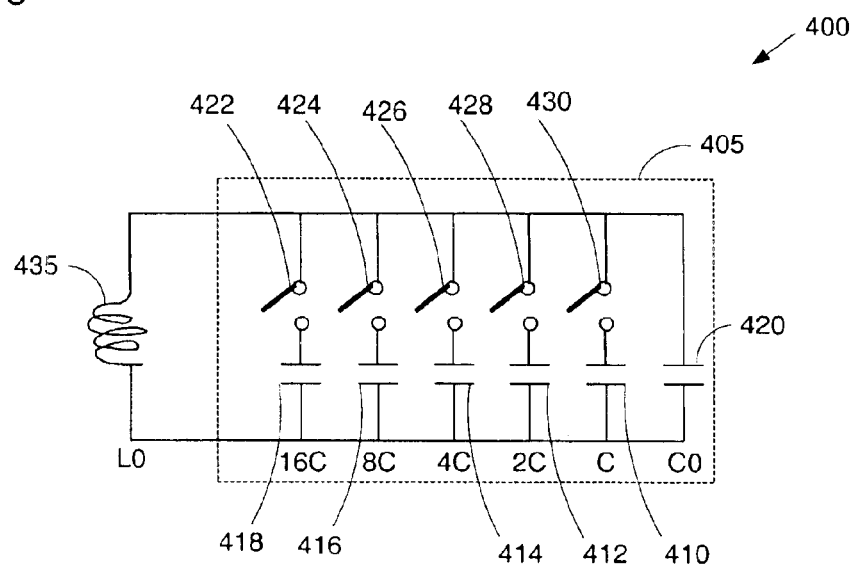
FIG. 4 illustrates one embodiment for an LC filter comprised of a capacitive bank and an inductor.

FIG. 4 illustrates one embodiment for an LC filter 400 comprised of a capacitive bank 405 and an inductor 435. For this embodiment, the capacitive bank 405 includes six capacitors (410, 412, 414, 416, 418, and 420). Although the LC filter 400 includes six capacitors and one inductor, any number of capacitors or inductors may be used without deviating from the spirit or scope of the invention. In one embodiment, the number and values for the capacitors and inductors is a function of the desired frequency response characteristics of the LC filter 400.

Each capacitor is selected (i.e., added) or deselected (i.e., removed) from the capacitive bank 405 through a corresponding switch (switches 422, 424, 426, 428, and 430). In one embodiment, the switches are implemented using metal oxide semiconductor ("MOS") transistors. Note that the sixth capacitor 420 in the capacitive bank 405 is always selected and has a predetermined capacitance value of C0. The other five capacitors (410, 412, 414, 416, and 418) are selected by the corresponding switches according to the control code produced by the controller 250.

In the example shown in FIG. 4, the control code would have 5 bits where each bit selects or deselects a capacitor having a particular capacitance value. For example, the least significant bit of the control code may be used to select or deselect a capacitor having a capacitance value of C and the most significant bit of the control code may be used to select or deselect a capacitor having a capacitance value of 16C. In some embodiments, a capacitor is selected through its corresponding switch by a bit in the control code that is set to 1. Therefore, as more bits in the control code are set to 1 and the value of the control code increases, more capacitors in the capacitive bank 405 are selected. The control code produces a particular combination of selected and deselected capacitors in the capacitive bank 405 that causes the LC filter 400 to exhibit a particular oscillation frequency. Thus, the LC filter 400 can be tuned to different oscillation frequencies by varying the control code.

The capacitors, which form capacitive bank 405, are configured in parallel. Therefore, as the value of the control code increases and more capacitors are selected, the effective capacitance of the capacitive bank 305 increases. Since the oscillation frequency of an LC filter is equal to $1/[2*pi*sqrt(L*C)]$, the oscillation frequency of the LC filter decreases as the control code increases.

Figure 6:
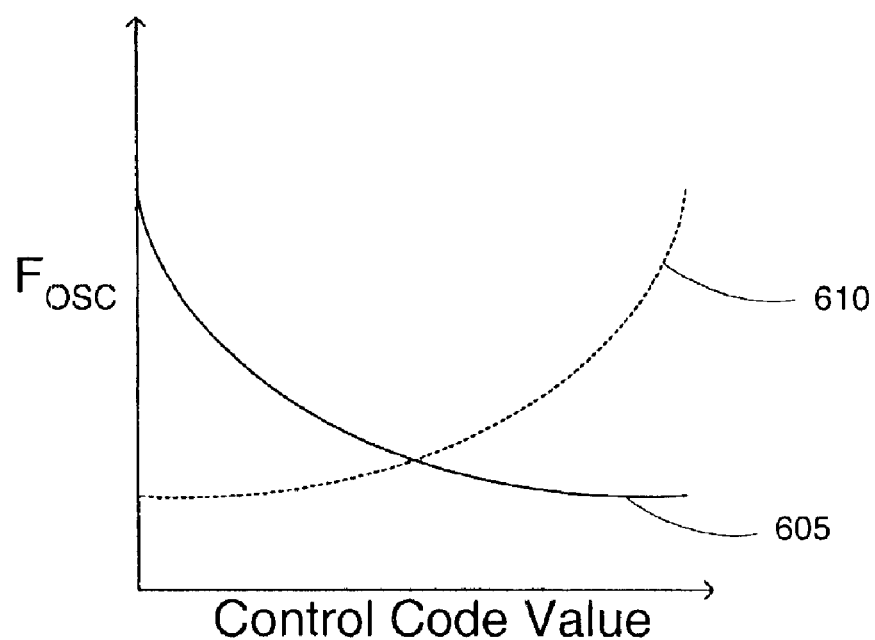
FIG. 6 is a graph that shows an example of the relationship between the oscillation frequency of an LC filter and the value of the control code.

FIG. 6 is a graph that shows an example of the relationship between the oscillation frequency of an LC filter and the value of the control code. As the values of the control code increases, the oscillation frequency of an LC filter decreases along an oscillation curve 605. Note that as the control code increases, the oscillation frequency of an LC filter decreases monotonically, i.e., the oscillation frequency follows an oscillation curve 605 that always has a negative slope. In accordance with the present invention, any type of filter having an oscillation frequency that is monotonically decreasing as the value of the control code increases may be tuned in the same manner as an LC filter, as described below in relation to FIG. 8.

The methods of the present invention may be easily adapted to tune filters that increase (e.g., RC filters) or decrease (e.g., LC filters) in oscillation frequency as the value of the control code increases. In some embodiments, the method used to tune an RC filter is adapted to tune an LC filter by inverting the bits of the control code and using the inverted control code bits to select or deselect capacitors in the LC filter. By inverting the bits of the control code, the oscillation frequency of an LC filter increases along an inverted oscillation curve 610 as the values of the control code increases. As such, the LC filter can then be tuned in the same manner as the RC filter.

Figure 7:
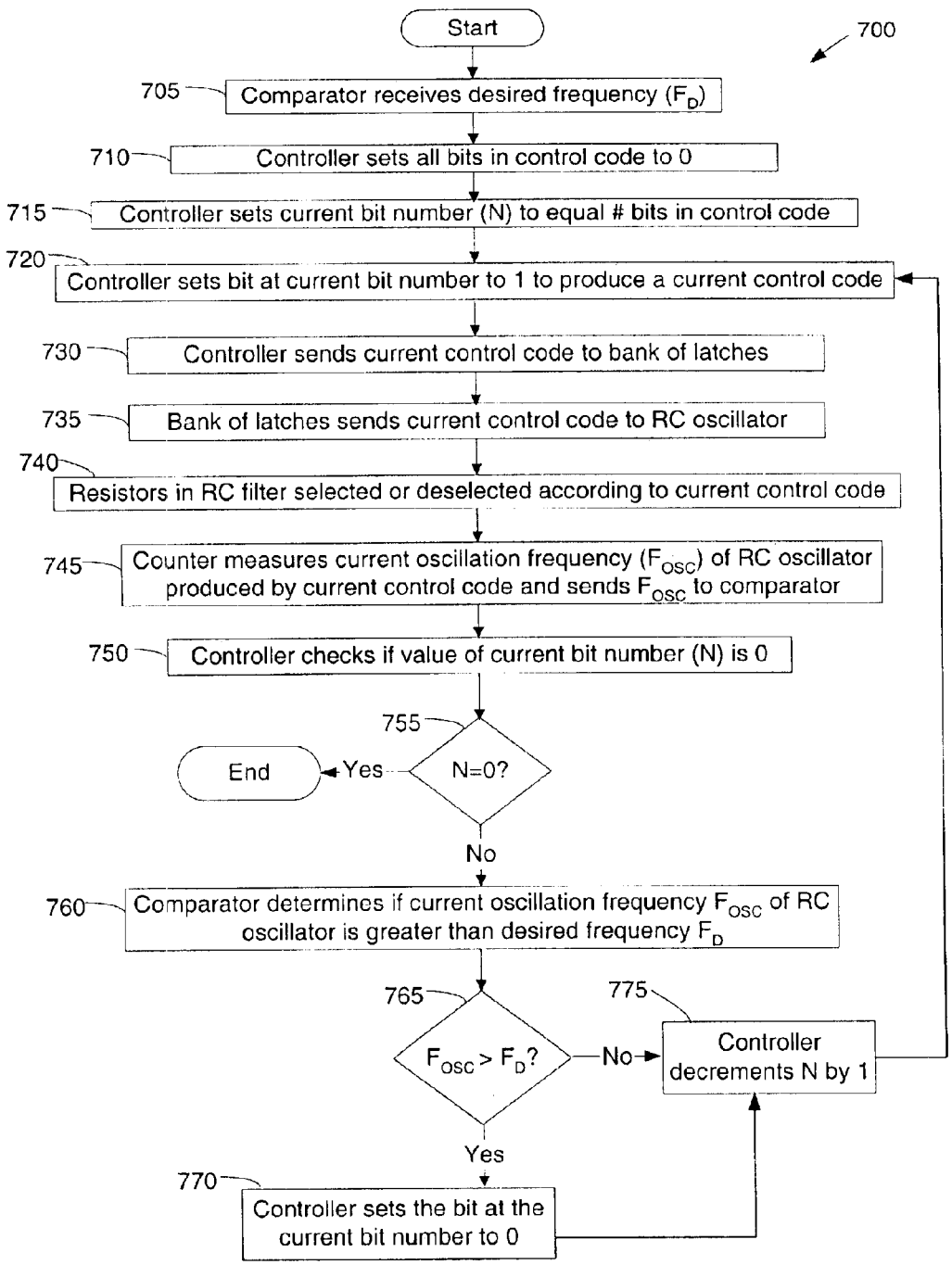
FIG. 7 is a flow diagram illustrating a process for tuning an RC filter to a desired frequency.

FIG. 7 is a flow diagram illustrating a process 700 for tuning an RC filter to a desired frequency. The process 700 is started when the comparator receives (at 705) a desired frequency ($F_D$) to which the RC filter is to be tuned. A controller then sets (at 710) all bits in a control code to 0.

The controller also sets (at 715) a current bit number (N) to equal the number of bits in the control code. The bits of the control code have positions in the control code numbered from the least significant bit (e.g., having a position number of 1) to the most significant bit (e.g., having a position number of 5 for a 5 bit control code). The controller then sets to 1 (at 720) the bit having a position number in the control code equal to the current bit number (N) in order to produce a current control code. The controller then sends (at 730) the current control code to a bank of latches for storage.

The bank of latches then sends (at 735) the current control code to an RC oscillator containing the RC filter. The resistors in the RC filter of the RC oscillator are then selected or deselected (at 740) according to the current control code. The current control code produces a particular combination of selected and/or deselected resistors in the RC filter that causes the RC oscillator to oscillate at a current oscillation frequency ($F_{OSC}$). A counter measures (at 745) the current oscillation frequency ($F_{OSC}$) produced by the current control code and the RC oscillator and sends the value of the current oscillation frequency ($F_{OSC}$) to the comparator.

The controller then checks (at 750) if the value of the current bit number (N) is equal to the position number of the least significant bit of the control code minus 1. For example, the controller checks (at 750) if the value of the current bit number (N) is equal to 0 if the position number of the least significant bit is 1. If so, the process 700 ends.

If the value of the current bit number (N) is not equal to 0 (at 755–No), the comparator determines (at 760) if the current oscillation frequency ($F_{OSC}$) of the RC oscillator is greater than the desired frequency ($F_D$). If so, the controller sets to 0 (at 770) the bit having a position number in the control code equal to the current bit number (N). The controller then decrements (at 775) the current bit number (N) by 1, i.e., N is set to equal N−1. If the comparator determines that the current oscillation frequency ($F_{OSC}$) is not greater than the desired frequency ($F_D$) (at 765–No), the controller decrements (at 775) the current bit number (N) by 1.

The process 700 continues at step 720 where the controller sets to 1 the bit having a position number in the control code equal to the current bit number (N) to produce a current control code. The process repeats steps 720 through 775 until the current bit number (N) is equal to the position number of the least significant bit of the control code minus 1. Therefore, the process 700 continues using successive approximation to determine the value of each bit of the control code until the value of the least significant bit of the control code is determined. By doing so, the process 700 converges on the value of the control code that produces an oscillation frequency in the RC oscillator that is closest to the desired frequency (with a maximum error of 1 least significant bit).

As an example, suppose a frequency of 320 MHz is desired and a 4 bit control code is used. Therefore, the current bit number (N) is equal to 4 and, for example, the least significant bit of the control code has a position numbered 1 and the most significant bit of the control code has a position numbered 4. The process 700 sets all bits to 0 and sets to 1 the bit having a position number equal to the current bit number (N=4) to produce a current control code of 1000. The current control code is used to select or deselect resistors in the RC filter of the RC oscillator which produces, for example, a current oscillation frequency of 280 MHz. Since the current oscillation frequency is not greater than the desired frequency of 320 MHz, the process 700 decrements the current bit number (N) to equal 3.

The process 700 then sets to 1 the bit having a position number equal to the current bit number (N=3) to produce a current control code of 1100. The current control code causes the RC oscillator to produce, for example, a current oscillation frequency of 346 MHz which is greater than the desired frequency of 320 MHz. Therefore, the process 700 sets to 0 the bit having a position number equal to the current bit number (N=3). The process 700 then decrements the current bit number (N) to equal 2.

The process 700 then sets to 1 the bit having a position number equal to the current bit number (N=2) to produce a current control code of 1010. The current control code causes the RC oscillator to produce, for example, a current oscillation frequency of 316 MHz which is not greater than the desired frequency of 320 MHz. Therefore, the process 700 then decrements the current bit number (N) to equal 1.

The process 700 then sets to 1 the bit having a position number equal to the current bit number (N=1) to produce a current control code of 1011. The current control code causes the RC oscillator to produce, for example, a current oscillation frequency of 330 MHz which is greater than the desired frequency of 320 MHz. Therefore, the process 700 sets to 0 the bit having a position number equal to the current bit number (N=1). Therefore, the control code is set to 1010 which causes the RC oscillator to produce an oscillation frequency of 316 MHz which is the closest oscillation frequency to the desired frequency of 320 MHz (with a maximum error of 1 least significant bit of the control code). The process 700 then decrements the current bit number (N) to equal 0 and the process 700 ends.

Figure 8:
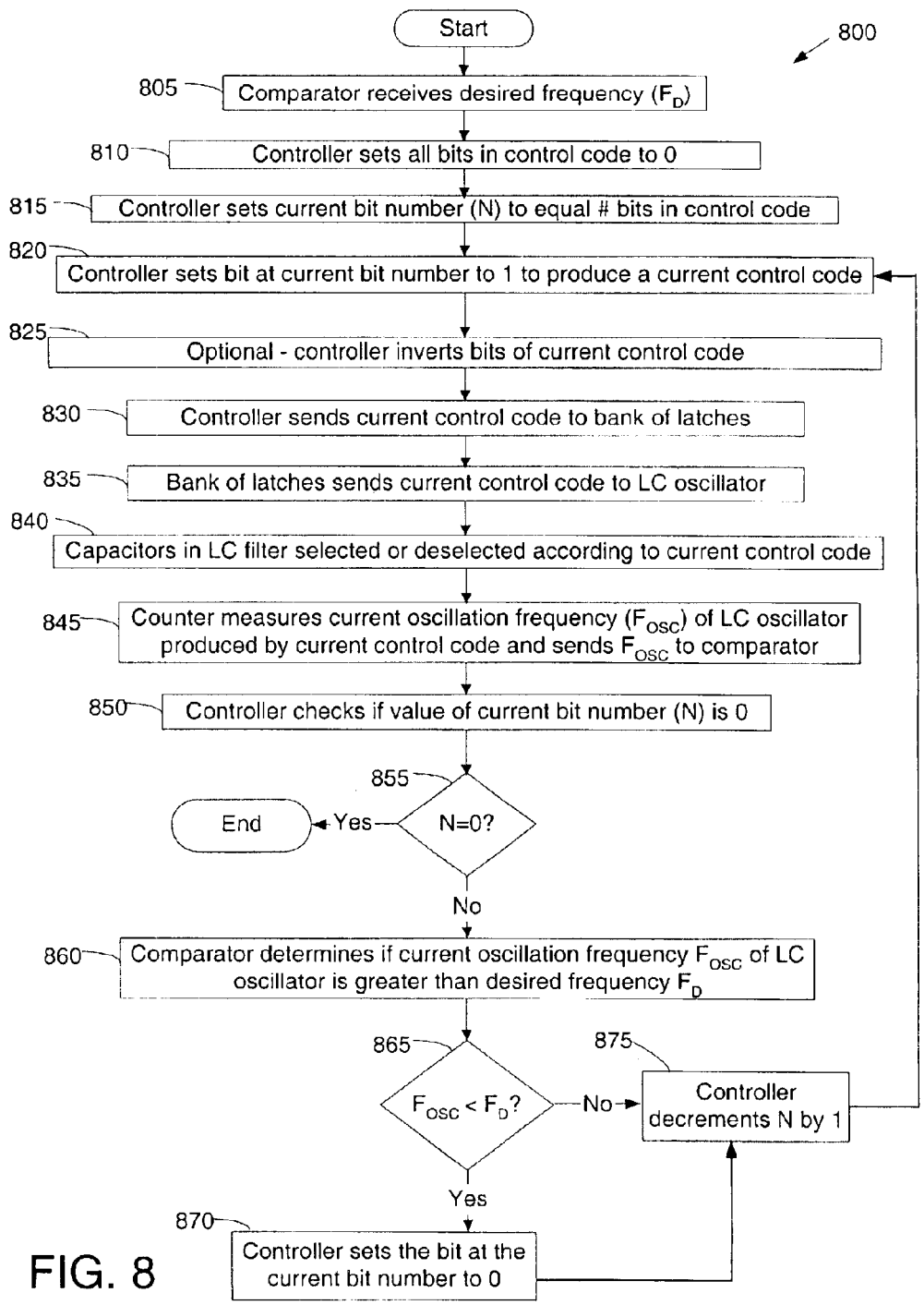
FIG. 8 is a flow diagram illustrating a process for tuning an LC filter to a desired frequency.

FIG. 8 is a flow diagram illustrating a process 800 for tuning an LC filter to a desired frequency. The process 800 for tuning an LC filter is similar to the process 700 for tuning an RC filter and only those steps that differ are discussed in detail here.

The process 800 is started when a comparator receives (at 805) a desired frequency ($F_D$) to which the LC filter is to be tuned. The controller sets (at 810) all bits in the control code to 0 and sets (at 815) a current bit number (N) to equal the number of bits in the control code. The controller then sets to 1 (at 820) the bit having a position number in the control code equal to the current bit number (N) in order to produce a current control code. The controller sends (at 830) the current control code to a bank of latches for storage.

The bank of latches then sends (at 835) the current control code to an LC oscillator containing the LC filter. The capacitors in the LC filter of the LC oscillator are then selected or deselected (at 840) according to the current control code. The current control code produces a particular combination of selected and/or deselected capacitors in the LC filter that causes the LC oscillator to oscillate at a current oscillation frequency ($F_{OSC}$). A counter measures (at 845) the current oscillation frequency ($F_{OSC}$) and sends the value of the current oscillation frequency ($F_{OSC}$) to the comparator.

The controller then checks (at 850) if the value of the current bit number (N) is equal to 0. If so, the process 800 ends. If the value of the current bit number (N) is not equal to 0 (at 855-No), the comparator determines (at 860) if the current oscillation frequency ($F_{OSC}$) of the LC oscillator is less than the desired frequency ($F_D$). If so, the controller sets to 0 (at 870) the bit having a position number in the control code equal to the current bit number (N). The controller then decrements (at 875) the current bit number (N) by 1. If the comparator determines that the current oscillation frequency ($F_{OSC}$) is not less than the desired frequency ($F_D$) (at 865-No), the controller decrements (at 875) the current bit number (N) by 1.

The process 800 continues at step 820 where the controller sets to 1 the bit having a position number in the control code equal to the current bit number (N) to produce a current control code. The process repeats steps 820 through 875 until the current bit number (N) is equal to 0. Therefore, the process 800 continues using successive approximation to determine the value of each bit of the control code until the value of the least significant bit of the control code is determined. By doing so, the process 800 converges on the value of the control code that produces an oscillation frequency in the LC oscillator that is closest to the desired frequency (with a maximum error of 1 least significant bit).

Note that in the process 700 used to tune an RC filter, the comparator determines (at 760) if the current oscillation frequency ($F_{OSC}$) of the RC oscillator is greater than the desired frequency ($F_D$). This is in contrast to the process 800 used to tune an LC filter where the comparator determines (at 860) if the current oscillation frequency ($F_{OSC}$) of the LC oscillator is less than the desired frequency ($F_D$). By simply changing the basis of the comparison between the oscillation frequency and the desired frequency, the process 700 used to tune an RC filter can be easily adapted to tune an LC filter.

The process 700 used to tune an RC filter can also be adapted to tune an LC filter by performing an optional inversion step (at 825). After the controller produces (at 820) the current control code, the controller inverts (at 825) the bits of the control code. As described above in relation to FIG. 6, using inverted control code bits to select or deselect capacitors in the LC filter causes the oscillation frequency of the LC filter to increase as the control code increases so that the LC filter can then be tuned in the same manner as an RC filter. If the optional inversion step is performed (at 825) and inverted control bits are used, the comparator determines (at 860) if the current oscillation frequency ($F_{OSC}$) of the LC oscillator is greater than the desired frequency ($F_D$), as is done for tuning an RC filter.

Although the present invention has been described above in terms of specific exemplary embodiments, one skilled in the art will realize that various modifications and alterations may be made to the below embodiments without departing from the spirit and scope of the invention. For example, methods of the present invention for tuning filters of a television tuner are described above. One skilled in the arts will realize, however, that the methods for tuning filters can also be applied to filters of other types of tuners. Also, some embodiments of the present invention relate to tuning RC type or LC type filters. It should be appreciated, however, that methods of the present invention may relate to any filter that exhibits monotonically increasing or monotonically decreasing oscillation frequencies as a control code (used to vary the frequency of the filter) increases in value.

What is claimed is:

1. A method for tuning a filter to a desired frequency, the method comprising:

providing a filter having a bank of elements, each element being selectable by a bit in a control code having a range of control code values, wherein various combinations of selected elements produce various oscillation frequencies of the filter; and tuning the filter to the desired frequency using an algorithm based on successive approximation, the tuning comprising:

setting an initial value of the control code to equal a middle value of the control code range.

2. The method of claim 1 wherein the filter is tuned to the desired frequency with a maximum error of 1 least significant bit of the control code.

3. The method of claim 1 wherein the setting comprises:

a) setting all bits in the control code to 0, the control code being comprised of a plurality of bits having positions numbered from L to M, where M has a greater value than L;

b) setting a current bit number to equal M; and c) setting the bit having a position in the control code at the current bit number to 1 in order to produce a current control code.

4. The method of claim 3 wherein the tuning further comprises:

d) determining whether a current oscillation frequency of the filter produced by the current control code is greater than the desired frequency;

e) setting the bit having a position in the control code at the current bit number to 0 if the current oscillation frequency of the filter is greater than the desired frequency;

f) decrementing the current bit number by 1;

g) setting the bit having a position in the control code at the current bit number to 1 to produce the current control code;

h) checking if the value of the current bit number is equal to L minus 1; and i) repeating steps d, e, f, g, and h until the value of the current bit number is equal to L minus 1.

5. The method of claim 4 wherein the filter monotonically increases in oscillation frequency as the value of the control code increases.

6. The method of claim 3 wherein the tuning further comprises:

d) determining whether a current oscillation frequency of the filter produced by the current control code is less than the desired frequency;

e) setting the bit having a position in the control code at the current bit number to 0 if the current oscillation frequency of the filter is less than the desired frequency;

f) decrementing the current bit number by 1;

g) setting the bit having a position in the control code at the current bit number to 1 to produce the current control code;

h) checking if the value of the current bit number is equal to L minus 1; and i) repeating steps d, e, f, g, and h until the value of the current bit number is equal to L minus 1.

7. The method of claim 6 wherein the filter monotonically decreases in oscillation frequency as the value of the control code increases.

8. The method of claim 6 wherein the filter monotonically decreases in oscillation frequency as the value of the control code increases, wherein the tuning further comprises:

before step d), inverting each bit in the current control code.

9. The method of claim 1 wherein the tuning further comprises:

comparing the oscillation frequency of the filter produced by the control code and the desired frequency; and
based on the comparison, adjusting the value of the control code to equal a value that is ¾ or ¼ of the control code range.

10. The method of claim 1 wherein the tuning further comprises:

repeatedly comparing the oscillation frequency of the filter produced by the control code and the desired frequency; and repeatedly adjusting the value of the control code based on the comparison, wherein the value of each bit of the control code is determined starting from the most significant bit to the least significant bit of the control code.

11. An apparatus configured to tune a filter to a desired frequency, the apparatus comprising:

means for providing a filter having a bank of elements, each element being selectable by a bit in a control code having a range of control code values, wherein various combinations of selected elements produce various oscillation frequencies of the filter; and means for tuning the filter to the desired frequency using an algorithm based on successive approximation, the means for tuning comprising:

means for setting an initial value of the control code to equal a middle value of control code range.

12. A circuit comprising:

a filter comprising a bank of elements, each element being selectable by a bit in a control code having a range of control code values, wherein various combinations of selected elements produce various oscillation frequencies of the filter; and a controller coupled to the filter, the controller being configured to tune the filter to a desired frequency by determining values of the control code using an algorithm based on successive approximation, the controller being further configured to set an initial value of the control code to equal a middle value of the control code range.

13. The circuit of claim 12 wherein the controller is configured to tune the filter to the desired frequency with a maximum error of 1 least significant bit of the control code.

14. The circuit of claim 12 wherein the controller is configured to set the initial value of the control code by:

setting all bits in the control code to 0, the control code being comprised of a plurality of bits having positions numbered from L to M, where M has a greater value than L;

setting a current bit number to equal M; and setting the bit having a position in the control code at the current bit number to 1 in order to produce a current control code.

15. The circuit of claim 14 wherein the filter monotonically increases in oscillation frequency as the value of the control code increases, the circuit further comprising:

a comparator coupled to the filter and the controller, the comparator configured to determine whether a current oscillation frequency of the filter produced by the current control code is greater than the desired frequency, wherein the controller is further configured to tune the filter by iteratively:

setting the bit having a position in the control code at the current bit number to 0 if the current oscillation frequency of the filter is greater than the desired frequency;

decrementing the current bit number by 1; and setting the bit having a position in the control code at the current bit number to 1 to produce the current control code, wherein the controller is further configured stop the iterations when value of the current bit number is equal to L minus 1.

16. The circuit of claim 15 wherein the filter is comprised of a capacitor coupled to a resistive bank, the resistive bank comprising a plurality of resistors where each resistor is selectable by a bit in the control code.

17. The circuit of claim 14 wherein the filter monotonically decreases in oscillation frequency as the value of the control code increases, the circuit further comprising:

a comparator coupled to the filter and the controller, the comparator configured to determine whether a current oscillation frequency of the filter produced by the current control code is less than the desired frequency, wherein the controller is further configured to tune the filter by iteratively:

setting the bit having a position in the control code at the current bit number to 0 if the current oscillation frequency of the filter is less than the desired frequency;

decrementing the current bit number by 1; and setting the bit having a position in the control code at the current bit number to 1 to produce the current control code, wherein the controller is further configured stop the iterations when value of the current bit number is equal to L minus 1.

18. The circuit of claim 17 wherein the filter is comprised of an inductor coupled to a capacitive bank, the capacitive bank comprising a plurality of capacitors where each capacitor is selectable by a bit in the control code.

19. The circuit of claim 12 further comprising:

a comparator coupled to the filter and the controller, the comparator configured to compare the oscillation frequency of the filter produced by the control code and the desired frequency, wherein the controller is further configured to:

adjust the value of the control code, based on the comparison, to equal a value that is ¾ or ¼ of the control code range.

20. The circuit of claim 12 further comprising:
a comparator coupled to the filter and the controller, the comparator configured to repeatedly compare the oscillation frequency of the filter produced by the control code and the desired frequency,
wherein the controller is further configured to:
repeatedly adjust the value of the control code based on the comparison, wherein the value of each bit of the control code is determined starting from the most significant bit to the least significant bit of the control code.

21. The circuit of claim 12 wherein the circuit is contained in a television tuner.

* * * * *